(12) United States Patent
Shih et al.

(10) Patent No.: US 8,987,914 B2
(45) Date of Patent: Mar. 24, 2015

(54) CONDUCTOR STRUCTURE AND METHOD

(71) Applicant: Macronix International Co., Ltd., Hsinchu (TW)

(72) Inventors: Yen-Hao Shih, Elmsford, NY (US); Yi-Hsuan Hsiao, Hsinchu (TW); Chih-Ping Chen, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 78 days.

(21) Appl. No.: 13/907,607

(22) Filed: May 31, 2013

(65) Prior Publication Data
US 2014/0217518 A1 Aug. 7, 2014

Related U.S. Application Data

(60) Provisional application No. 61/761,710, filed on Feb. 7, 2013.

(51) Int. Cl.
- *H01L 23/498* (2006.01)
- *H01L 21/768* (2006.01)
- *H01L 27/115* (2006.01)

(52) U.S. Cl.
CPC ..... *H01L 27/11573* (2013.01); *H01L 27/11582* (2013.01)
USPC .............. 257/773; 257/774; 257/E23.011; 257/E21.585; 438/622; 438/637; 438/675

(58) Field of Classification Search
USPC .......... 257/773, 774, E23.011, E21.585; 438/622, 637, 675
See application file for complete search history.

(56) References Cited

U.S. PATENT DOCUMENTS

| 6,034,882 A | 3/2000 | Johnson et al. |
| 6,323,117 B1 | 11/2001 | Noguchi |

(Continued)

FOREIGN PATENT DOCUMENTS

| EP | 1936681 A1 | 6/2008 |
| EP | 2048709 A2 | 4/2009 |

(Continued)

OTHER PUBLICATIONS

U.S. Appl. No. 14/045,573, "Interlayer Conductor Structure and Method", filed on Oct. 3, 2013.

(Continued)

*Primary Examiner* — Minh-Loan Tran
(74) *Attorney, Agent, or Firm* — Haynes Beffel & Wolfeld LLP

(57) ABSTRACT

A method of forming an interlayer conductor structure. The method includes forming a stack of semiconductor pads coupled to respective active layers for a circuit. The semiconductor pads include outside perimeters each having one side coupled to a respective active layer. Impurities are implanted along the outside perimeters to form outside lower resistance regions on the pads. Openings are then formed in the stack of the semiconductor pads to expose a landing area for interlayer conductors on a corresponding semiconductor pad and to define an inside perimeter on at least one of the semiconductor pads. Inside lower resistance regions are formed along the inside perimeters by implanting impurities for interlayer conductor contacts and configured to overlap and be continuous with the corresponding outside lower resistance region.

27 Claims, 19 Drawing Sheets

(56) References Cited

U.S. PATENT DOCUMENTS

| | | | |
|---|---|---|---|
| 6,906,361 | B2 | 6/2005 | Zhang |
| 6,906,940 | B1 | 6/2005 | Lue |
| 7,018,783 | B2 | 3/2006 | Iwasaki et al. |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,274,594 | B2 | 9/2007 | Pascucci et al. |
| 7,315,474 | B2 | 1/2008 | Lue |
| 7,382,647 | B1 | 6/2008 | Gopalakrishnan |
| 7,420,242 | B2 | 9/2008 | Lung |
| 7,696,559 | B2 | 4/2010 | Arai et al. |
| 7,851,849 | B2 | 12/2010 | Kiyotoshi |
| 8,338,882 | B2 * | 12/2012 | Tanaka et al. ............. 257/324 |
| 8,363,476 | B2 | 1/2013 | Lue et al. |
| 8,383,512 | B2 | 2/2013 | Chen et al. |
| 8,437,192 | B2 * | 5/2013 | Lung et al. ............ 365/185.17 |
| 8,467,219 | B2 | 6/2013 | Lue |
| 8,503,213 | B2 | 8/2013 | Chen et al. |
| 8,736,069 | B2 | 5/2014 | Chiu et al. |
| 8,759,899 | B1 | 6/2014 | Lue et al. |
| 2004/0023499 | A1 | 2/2004 | Hellig et al. |
| 2004/0188822 | A1 | 9/2004 | Hara |
| 2005/0280061 | A1 | 12/2005 | Lee |
| 2007/0045708 | A1 | 3/2007 | Lung |
| 2007/0090434 | A1 | 4/2007 | Davies et al. |
| 2007/0140001 | A1 | 6/2007 | Motoi et al. |
| 2007/0231750 | A1 | 10/2007 | Parikh |
| 2007/0252201 | A1 | 11/2007 | Kito et al. |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0001530 | A1 | 1/2009 | Goto |
| 2009/0032966 | A1 | 2/2009 | Lee et al. |
| 2009/0097321 | A1 | 4/2009 | Kim et al. |
| 2009/0184360 | A1 | 7/2009 | Jin et al. |
| 2010/0007001 | A1 | 1/2010 | Wang et al. |
| 2010/0054015 | A1 | 3/2010 | Lee et al. |
| 2010/0109164 | A1 | 5/2010 | Kang et al. |
| 2010/0133645 | A1 | 6/2010 | Dunne |
| 2010/0182041 | A1 | 7/2010 | Feng et al. |
| 2010/0225000 | A1 | 9/2010 | Sugizaki et al. |
| 2010/0270593 | A1 | 10/2010 | Lung et al. |
| 2011/0031630 | A1 | 2/2011 | Hashimoto |
| 2011/0057321 | A1 | 3/2011 | Wang et al. |
| 2011/0116309 | A1 | 5/2011 | Lung |
| 2011/0235408 | A1 | 9/2011 | Minemura et al. |
| 2012/0119283 | A1 | 5/2012 | Lee et al. |
| 2012/0182806 | A1 | 7/2012 | Chen et al. |
| 2013/0082341 | A1 | 4/2013 | Shimizu et al. |
| 2013/0341797 | A1 | 12/2013 | Lim |
| 2014/0264934 | A1 * | 9/2014 | Chen ............................ 257/774 |

FOREIGN PATENT DOCUMENTS

| | | |
|---|---|---|
| EP | 2192612 A2 | 6/2010 |
| TW | I308374 B | 4/2009 |
| TW | 201123266 A | 7/2011 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Extended European Search Report for EP 12170759, dated Feb. 5, 2013, 12 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, pp. 350-355, 2010.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Nowak et al., "Intrinsic fluctuations in Vertical NAND flash memories," 2012 Symposium on VLSI Technology, Digest of Technical Papers, pp. 21-22, Jun. 12-14, 2012.

Paul et al., "Impact of a Process Variation on Nanowire and Nanotube Device Performance," IEEE Trans. on Electron Devices, vol. 54, No. 9, Sep. 2007, pp. 2369-2376.

(56) References Cited

OTHER PUBLICATIONS

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

614

CONDUCTOR STRUCTURE AND METHOD

RELATED APPLICATIONS

This application claims benefit of U.S. Provisional Patent Application No. 61/761,710 filed on 7 Feb. 2013, which application is incorporated by reference as if fully set forth herein.

BACKGROUND

The present invention relates to high density memory devices. In particular, embodiments of the present invention provide a method for manufacturing and a structure for connecting to multiple planes in a three-dimensional high density memory device.

Three dimensional (3D) memory devices are characterized by multiple layers, each of which can include a planar array of memory cells. For certain three-dimensionally stacked memory devices, active layers can comprise active strips of materials configured as bit lines or word lines for memory cells, stacked in spaced-apart ridge-like structures. The active layers can be made from a doped (p-type or n-type) or undoped semiconductor material. In such 3D memory, memory cells can be disposed at the cross-points of the stacked bit lines or word lines and the crossing word lines or bit lines, forming a 3D memory array.

Examples of memory devices like this are described in commonly owned U.S. Patent Publication No. 2012/0182806, filed Apr. 1, 2011, entitled Memory Architecture of 3D Array With Alternating Memory String Orientation and String Select Structures by inventors Shih-Hung Chen and Hang-Ting Lue and in commonly owned U.S. Pat. No. 8,363,476, filed 19 Jan. 2011, entitled Memory Device, Manufacturing Method And Operating Method Of The Same, by inventors Hang-Ting Lue and Shi-Hung Chen, both of which are incorporated by reference as if fully set forth herein. In these examples, the active strips are coupled to pads on each layer. The pads are arranged in stairstep structures to provide landing areas for interlayer conductors. For large arrays in particular, the resistance of the pads can be relatively high, slowing down operation of the device. Also, the current paths to the individual active strips across the array can vary, making control circuitry and sensing circuitry more complex.

It is desirable, therefore, to provide a structure for making contact to a plurality of layers in a 3D device that has lower resistance, and that causes less variation in operating characteristics across the device.

SUMMARY

An interconnect structure for a 3D device is described that comprises a stack of semiconductor pads, each coupled to a plurality of strips of active material in corresponding active layers. A semiconductor pad in the stack has an outside perimeter with at least one side of the outside perimeter coupled to a respective active layer. Outside perimeter lower resistance regions are disposed along the outside perimeters of semiconductor pads in the stack which decrease electrical resistance in the outside perimeter lower resistance regions relative to the inner regions. Semiconductor pads in the stack also have openings that expose a landing area or landing areas on an underlying pad or pads. The opening defines an inside perimeter on the pad. Inside perimeter lower resistance regions can also be disposed along the inside perimeters of the pads in the stack, and also decrease electrical resistance in the inside perimeter lower resistance regions relative to the inner regions.

The outside perimeter lower resistance regions can be formed, according to embodiments of the technology described herein, by implanting impurities directed at one or more angles away from normal into a patterned stack of pads. The openings in the pads can be formed after the outside perimeter lower resistance regions in some examples. The inside perimeter lower resistance regions can be formed along the inside perimeters of the semiconductor pads by implanting impurities at one or more substantially normal angles to decrease the resistivity in the inside perimeter lower resistance region and to decrease the resistivity in each of the exposed landing areas, relative to interior areas of the semiconductor pads. The inside perimeter lower resistance regions include at least the landing areas and in embodiments described herein further include an overlapping region that overlaps with the outer perimeter lower resistance regions forming a low resistance path on the corresponding semiconductor pad. Many benefits can be achieved by way of the present invention over conventional techniques. For example, the present method can be applied to a stack of semiconductor pads for contact conductor structures having a high layer count, greater than, for example, four. The contact region on each semiconductor pad is characterized by a suitably high conductance for high speed operations. Various other aspects and advantages are described throughout the specification and the appended claims.

DETAILED DESCRIPTION

Figure 1:
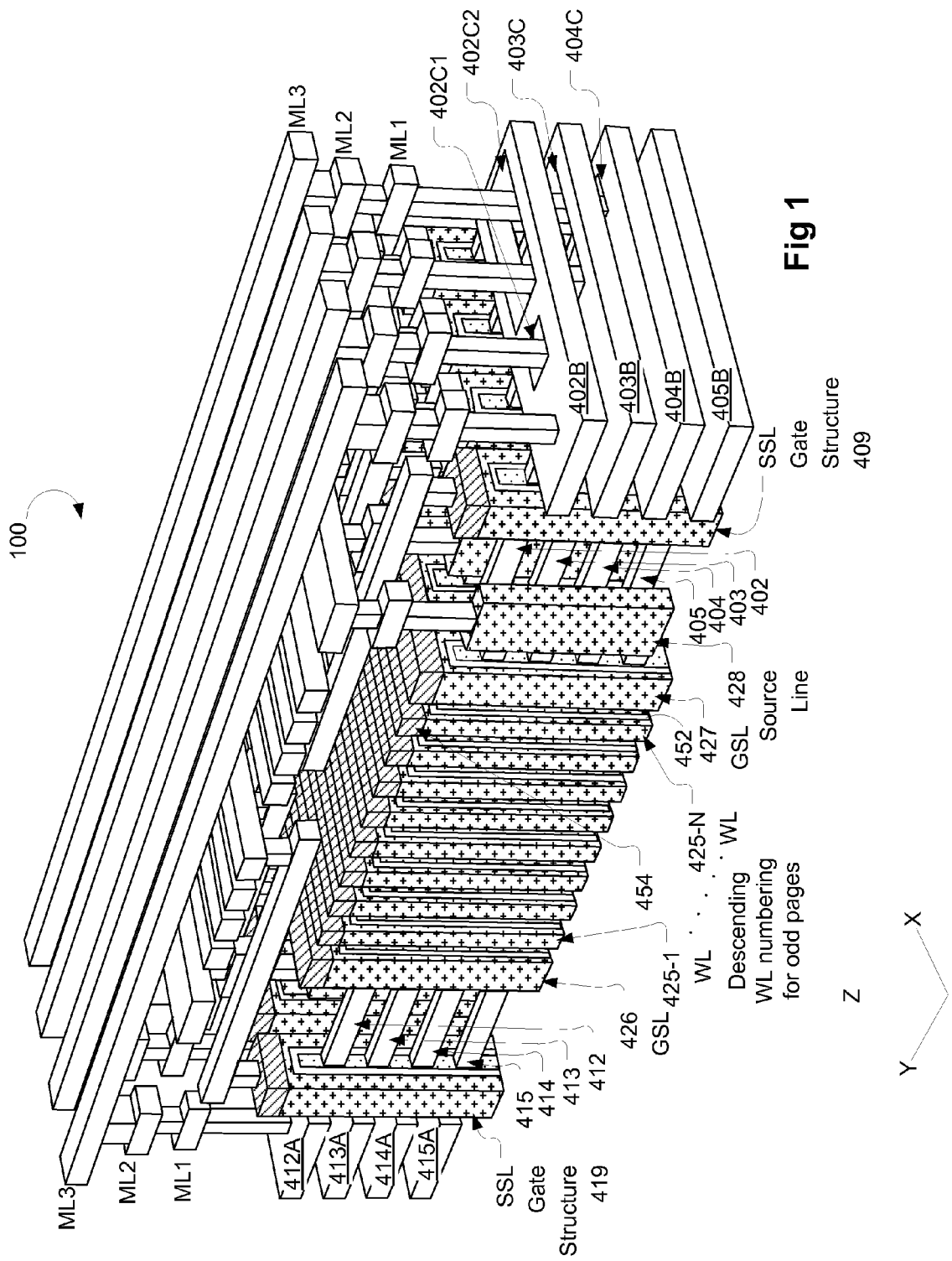
FIG. 1 is a perspective drawing of a semiconductor device including semiconductor pads for interconnect contact conductors.

A detailed description of various embodiments is described with reference to the Figures. The following description will typically be with reference to specific structural embodiments and methods. It is to be understood that there is no intention to limit the invention to the specifically disclosed embodiments and methods, but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective view of an example of a 3D semiconductor device (for example, a memory device) 100 as described in commonly owned U.S. Publication No. 2012/0182806, referred to above. Various insulating materials are formed but not shown to better illustrate active layers, including semiconductor strips and semiconductor pads for connecting to interlayer conductors, and others. 3D semiconductor device 100 is formed overlying a substrate (not shown)

having an insulating layer (not shown) formed thereon. The substrate can include one or more integrated circuits and other structures. Four semiconductor pads 402B, 403B, 404B, and 405B on a proximal end of a stack of active layers and four semiconductor pads 412A, 413A, 414A, and 415A on a distal end of the stack, are shown, but the number of active layers and the corresponding semiconductor pads can be extended to any number of layers N, where N is an integer having a value greater than one. As shown, the 3D semiconductor device includes stacks of active strips (e.g. 402, 403, 404, 405) separated by insulating material. Semiconductor pads (e.g. 402B, 403B, 404B, and 405B) terminate the strips in corresponding active layers. As illustrated, the semiconductor pads 402B, 403B, 404B, and 405B are electrically coupled to the active layers for connection to decoding circuitry to select layers within the array. Semiconductor pads 402B, 403B, 404B, and 405B can be patterned concurrently as the active layers are patterned, with the possible exception of vias for the interlayer connectors. Each of the active strips includes a semiconductor material suitable to act as a channel region in the illustrated embodiment. The strips are ridge-shaped extending on the Y-axis as illustrated, so that the active strips 402, 403, 404, 405 can be configured as bodies including channel regions of flash memory cell strings, for example, in horizontal NAND string configurations. As illustrated, a layer 452 of memory material coats the plurality of stacks of active strips in this example, and at least on the side walls of the active strips in other examples. In other embodiments, the active strips can be configured as word lines for vertical NAND string configurations. See, for example, commonly owned U.S. Pat. No. 8,363,476, referred to above.

Each stack of active strips is terminated at one end by semiconductor pads and the other end by a source line. Therefore, active strips 402, 403, 404, 405 terminate on the proximal end by semiconductor pads 402B, 403B, 404B, and 405B and a source line terminal 419 on the distal end of the strips passing through gate select line 427. Active strips 412, 413, 414, 415 terminate on the distal end by semiconductor pads 412A, 413A, 414A, and 415A and a source line terminal (for example, source line 428) passing through gate select line 426 near the proximal end of the strips.

In the embodiment of FIG. 1, a plurality of conductors 425-1 through 425-N is arranged orthogonally over the plurality of stacks of active strips. The conductors 425-N, have surfaces conformal with the plurality of stacks of active strips, within the trenches defined by the plurality of stacks, and defining a multilayer array of interface regions at cross-points between side surfaces of the active strips 402, 403, 404, 405 on the stacks and conductors 425-1 through 425-N (for example, word lines or source select lines). As shown, a layer of silicide (e.g. tungsten silicide, cobalt silicide, titanium silicide or nickel silicide) 454 can be formed over the top surfaces of conductors (for example, word lines or source select lines).

Depending upon the implementation, layer 452 of memory material can comprise multilayer dielectric charge storage structures. For example, a multilayer dielectric charge storage structure includes a tunneling layer comprising a silicon oxide, a charge trapping layer comprising a silicon nitride, and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 452 of memory material can comprise only a charge trapping layer without the tunneling layer or the blocking layer.

In the alternative, an anti-fuse material such as a silicon dioxide, silicon oxynitride or other silicon oxides, for example having a thickness on the order of 1 to 5 nanometers, can be utilized. Other anti-fuse materials may be used, such as silicon nitride. For anti-fuse embodiments, active strips 402, 403, 404, 405 can be a semiconductor material with a first conductivity type (e.g. p-type). Conductors (for example, word lines or source select lines) 425-N can be a semiconductor material with a second conductivity type (e.g. n-type). For example, the active strips 402, 403, 404, 405 can be made using p-type polysilicon while the conductors 425-N can be made using relatively heavily doped n+-type polysilicon or relatively heavily doped p+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Some of such materials can form devices that can be programmed and erased at multiple voltages or currents, and can be implemented for operations storing multiple bits per cell.

As can be seen in FIG. 1, the semiconductor pads 402B, 403B, 404B, and 405B are coupled on one side to active strips in the corresponding layer of the device, such as by being formed of a continuous patterned layer of semiconductor. In some embodiments, the pad can be coupled on two sides to active strips in the corresponding layer. In other embodiments, the pads can be connected to the active strips using other materials and structures that allow for electrical communication of the voltages and currents needed for operation of the device. Also, the semiconductor pads 402B, 403B, 404B, and 405B, except the lowermost pad, include openings 402C1, 402C2, 403C1, 403C2, 404C, that expose landing areas on underlying pads forming a stairstep structure in this example. The openings define inside perimeters on the pads.

FIGS. 2-13, 7A, 7B, 8A, 10A-13A, 13B are diagrams illustrating stages of a method of forming interconnect contact structures for conductive lines connecting active elements to various controlling circuitries (including, for example, a read circuitry or a decoding circuitry) for a high density 3D semiconductor device, for example, a memory device.

Figure 2:
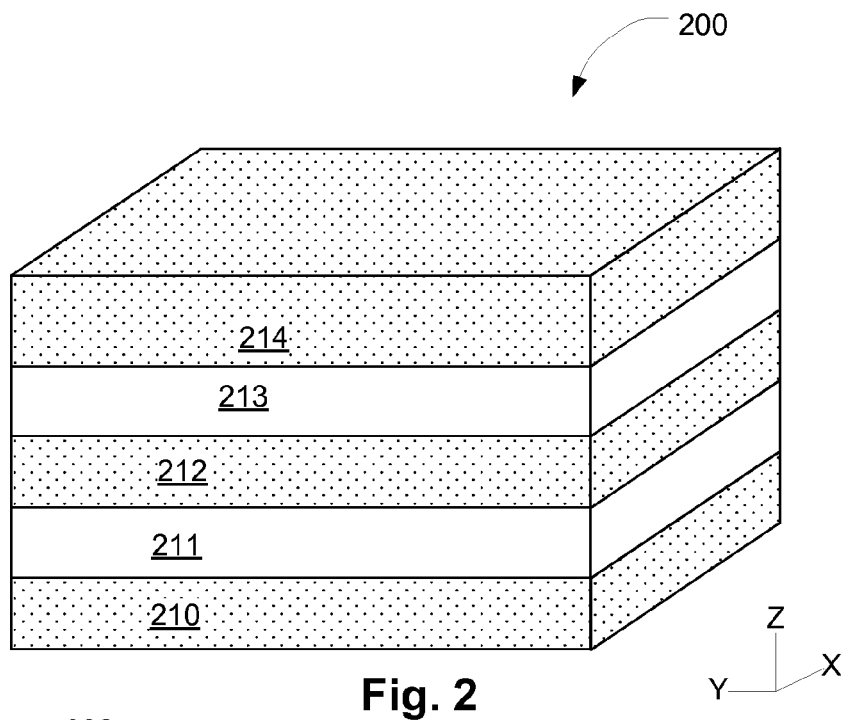
FIGS. 2-13, 7A, 7B, 8A, 10A-13A, 13B illustrate stages in a method for forming a conductor structure for a 3D semiconductor device.

FIG. 2 illustrates a stage in a manufacturing method for forming interconnect contact structures showing a stack 200 of semiconductor layers 211, 213 separated by insulator layers 212 in a perspective drawing. An insulator layer 214 overlies semiconductor layer 213. Only two semiconductor layers 211, 213 are shown in this illustration, however, many layers can be included. Each of the semiconductor layers 211, 213 can be lightly doped using a suitable impurity species (n-type or p-type) or undoped such that each of the semiconductor layers can have a first resistance. The stack of semiconductor layers is formed overlying a semiconductor substrate 216 and insulated from substrate 216 by an insulating layer 210. Semiconductor substrate 216 can be silicon, silicon-on-insulator, silicon germanium, and others. Depending on the implementation, one or more types of control circuitry may be formed on substrate 216. Insulating layer 210 can be silicon oxide, silicon nitride, multilayer stack such as alternating layers of silicon oxide and silicon nitride (for example, an ONO stack), high K dielectric, low K dielectric, and others.

Figure 3:
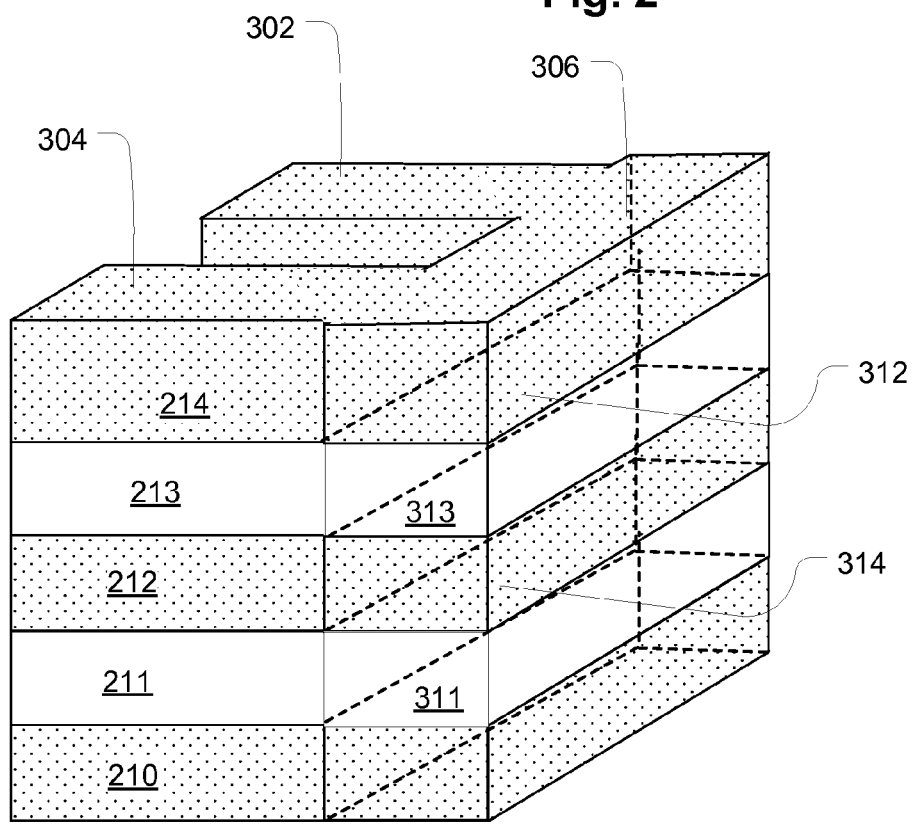

FIG. 3 is a perspective drawing of a plurality of spaced apart stacks 302, 304 of active strips coupled to a stack of semiconductor pads 306 formed from the stack of semiconductor layers 200. The stack of semiconductor layers 200 including overlying insulator layer 214 is subjected to a pattern and etch process to form a plurality of spaced apart stacks 302, 304 of active strips coupled to semiconductor pads 306. Two stacks 302, 304 are illustrated, but the number of stacks of active strips depending on the design and application and can be many more, for example, 8, 32, 64, 128, and so on. The pattern and etch process includes using a patterned mask (not shown) formed over insulator layer 214 overlying the semiconductor layers and an etching process is performed. The patterned mask can be made from a photosensitive material such as photoresist, or a hard mask material. The hard mask material can be a dielectric material such as silicon oxide or silicon nitride. The hard mask material can also be a metal material, and others. As shown in this example, the plurality of spaced apart stacks 302, 304 each has a ridge-like structure and is aligned in the Y-direction while the stack of semiconductor pads 306 is arranged perpendicular to the spaced apart stacks 302, 304 of active strips and aligned in the X-direction. Each of the strips includes a corresponding portion of the semiconductor layers 211, 213 separated by insulating layer 212. One side of each of the semiconductor pads is coupled to the active strips in the layer. As shown, side 312 of semiconductor pad 313 is coupled to the strips from semiconductor layer 213 and side 314 of semiconductor pad 311 is coupled to the strips from semiconductor layer 211. The semiconductor pads 313, 311 are characterized by an outside perimeter, including first and second sides along a longitudinal direction (along X- direction in the drawing) and ends having a width in a traverse direction (in the Y-direction).

Figure 4:
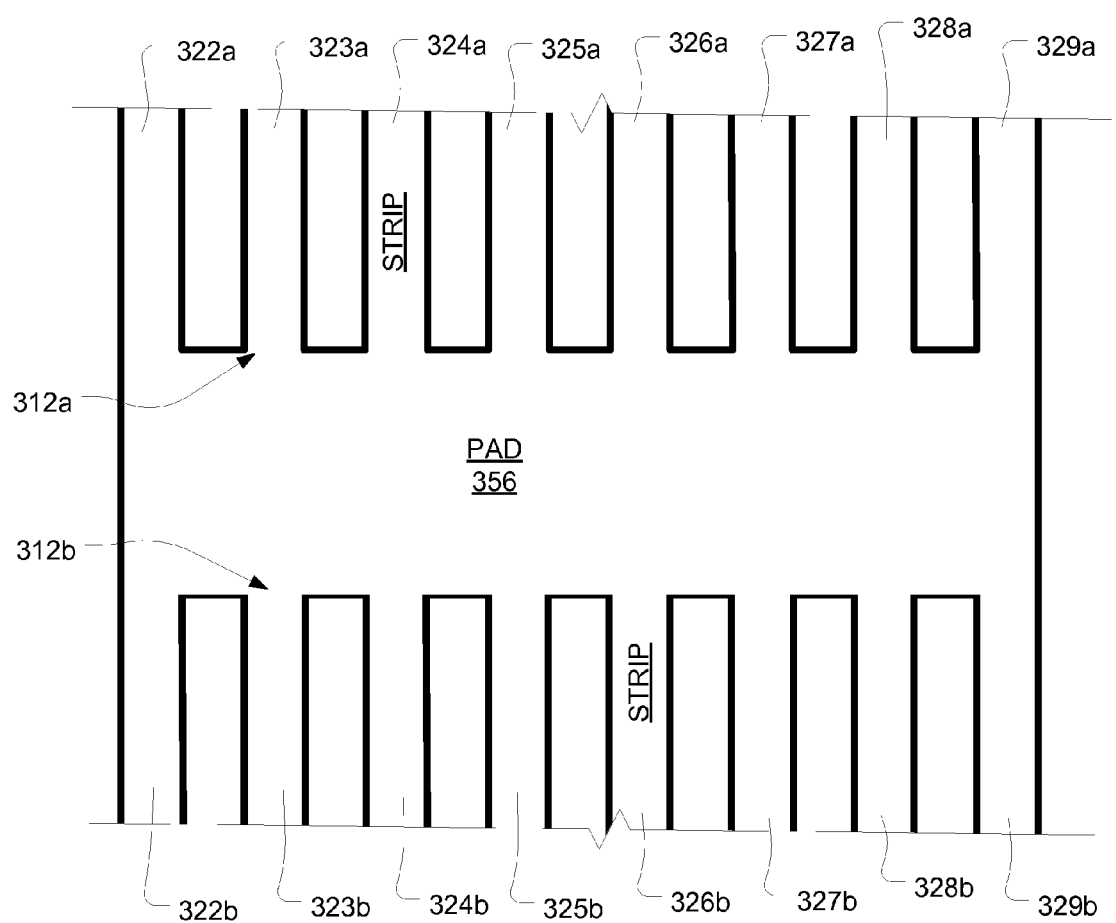

FIG. 4 shows a simplified layout of a patterned layer of active material, including active strips 322a-329a on a first side 312a of a semiconductor pad 356, and active strips 322b-329b on a second side 312b of the pad 330. Each of the semiconductor pads in stack 306, like the pad 356 has an outside perimeter including at least one side (312a or 321b) coupled to the corresponding layer of active strips.

Figure 5:
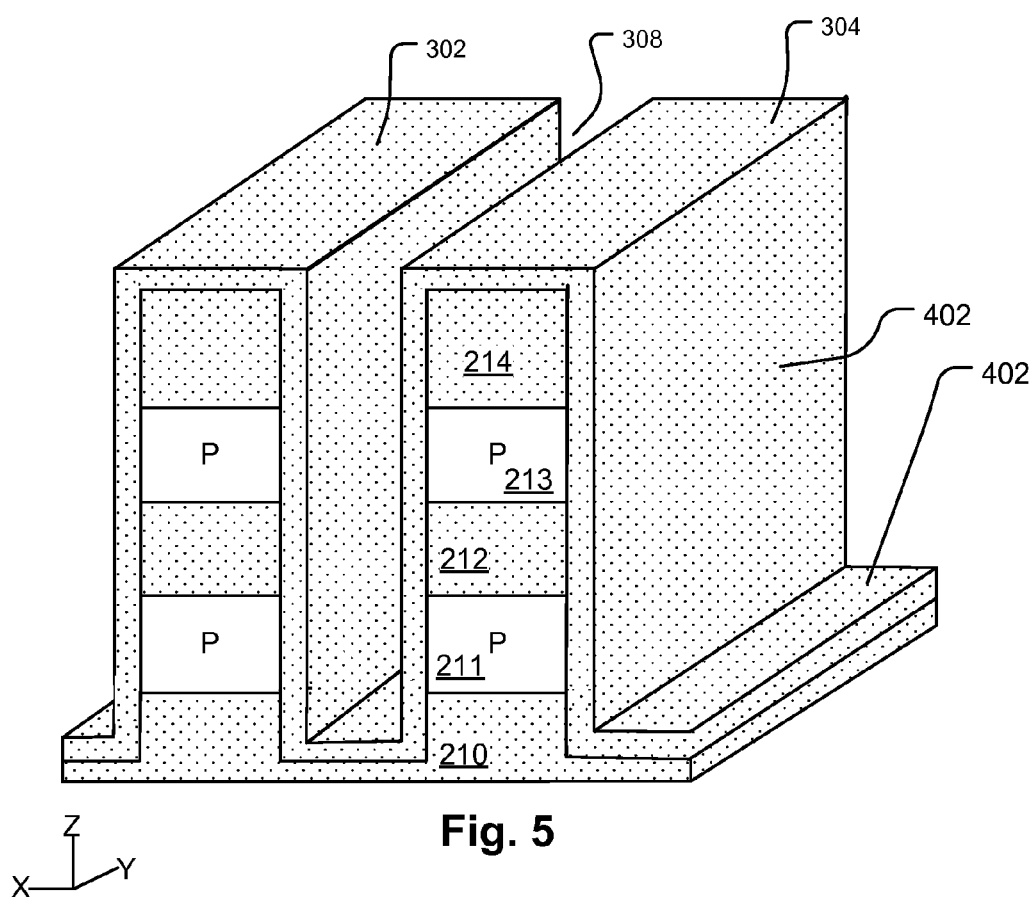

FIG. 5 is a perspective drawing of the stacks of active layers 302, 304 (with the pads removed to simplify the drawing) after a blanket deposition of a memory material 402 over the stacks and exposed region of insulating layer 210. This blanket deposition can be done while the pad regions in the stacks are covered by a mask. To better illustrate the various components, the stack of semiconductor pads 306 is not shown in this drawing and the Y-Z plane is front-facing. Gap 308 in between the stacks of active layers 302 and 304 is also shown. Memory material 402 can have a dielectric charge trapping structure, as discussed above in connection with FIG. 1, or other memory material.

Figure 6:
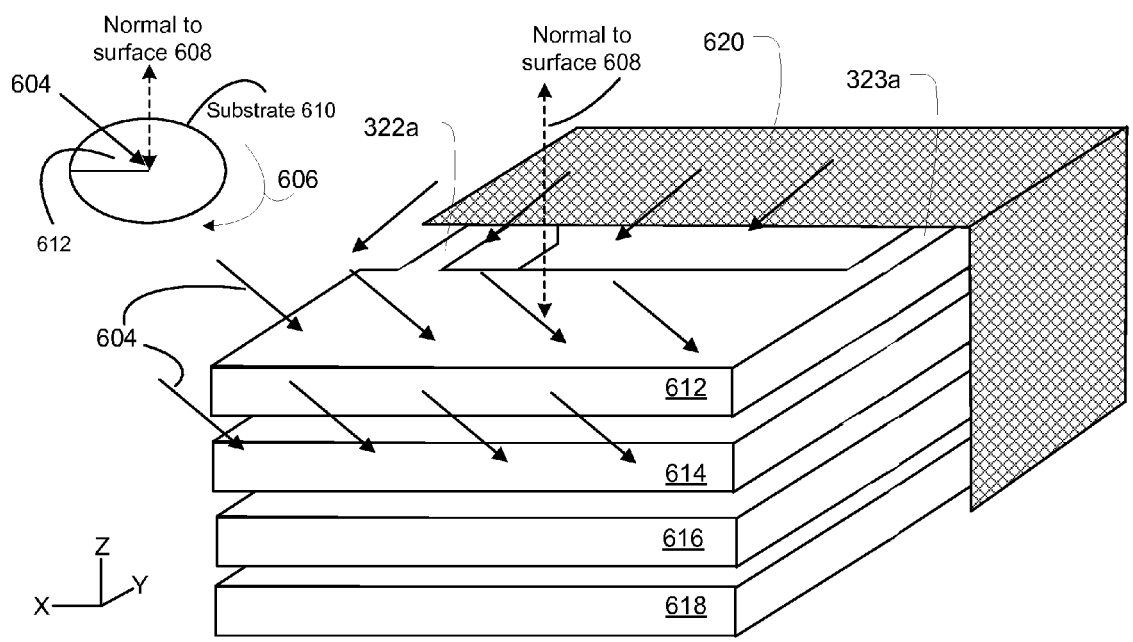

FIG. 6 is a simplified perspective drawing of the active layers and the stack of semiconductor pads like that in FIG. 3 while being subjected to a first implantation process using impurities 604. Impurities 604 have the same conductivity type (n-type or p-type) as the semiconductor layers (211, 213 in FIG. 2). In other implementations, impurities 604 can have a different conductivity type from the semiconductor layers. In this drawing, four semiconductor pads 612, 614, 616, 618 in four active layers and corresponding stacks 322a, 323a of active strips layers are illustrated and the stack of semiconductor pads is front-facing. The insulating layers between the semiconductor pads are not shown for purposes of clarity. As shown, impurities 604 are implanted at an incident angle or angles tilted to cause implantation in the outside perimeter regions of the pads, where the tilt angles can be for example 0 to 89 degrees relative to a normal substrate 610 surface (commonly referred as tilt angle). During implantation, substrate 610 can also be rotated 606 in the XY plane allowing for the impurity ions 604 to incident at one or more angle 612 relative to a crystal plane of the substrate (twist angle). In various embodiments, the tilt angle, the twist angle, and the ion energy, and others are selected such that a continuous outside perimeter lower resistance region 702 is formed along the perimeter of each of the semiconductor pads 612, 614. 616, 618 in the stack as further illustrated in FIGS. 7, 7A, and 8. Additionally, the impurities can be implanted while the active strips in the stacks (302, 304) are covered by a mask 620, so that the implantation process does not substantially change the resistance of the strips of active material in the plurality of active layers.

Figure 7:
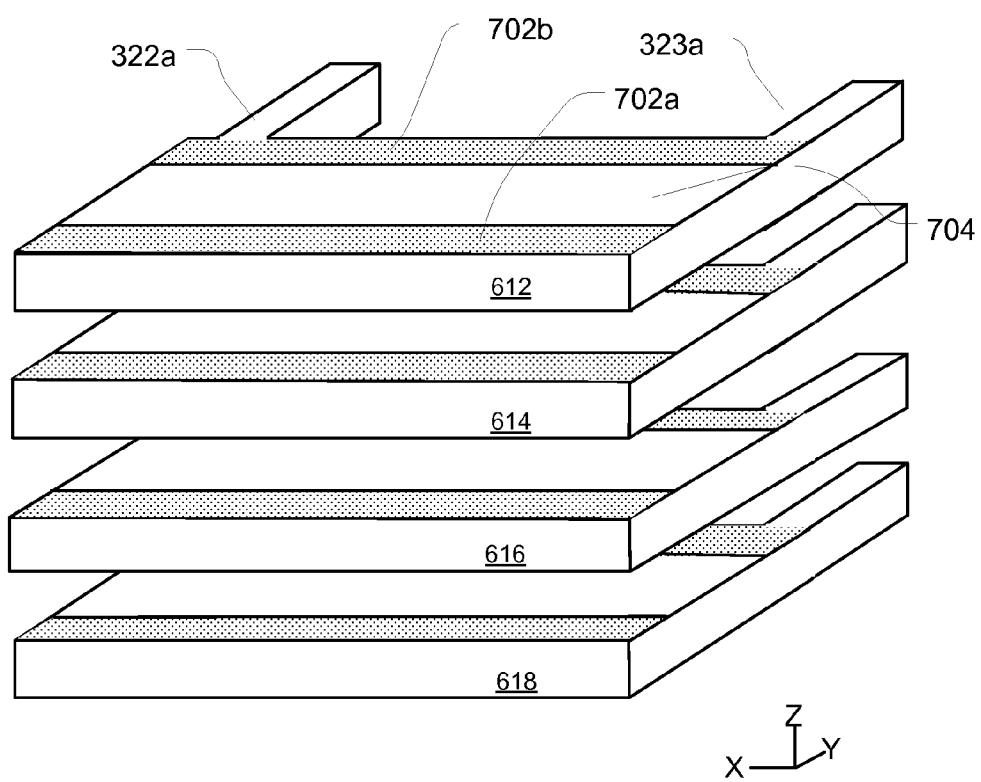
Figure 7A:
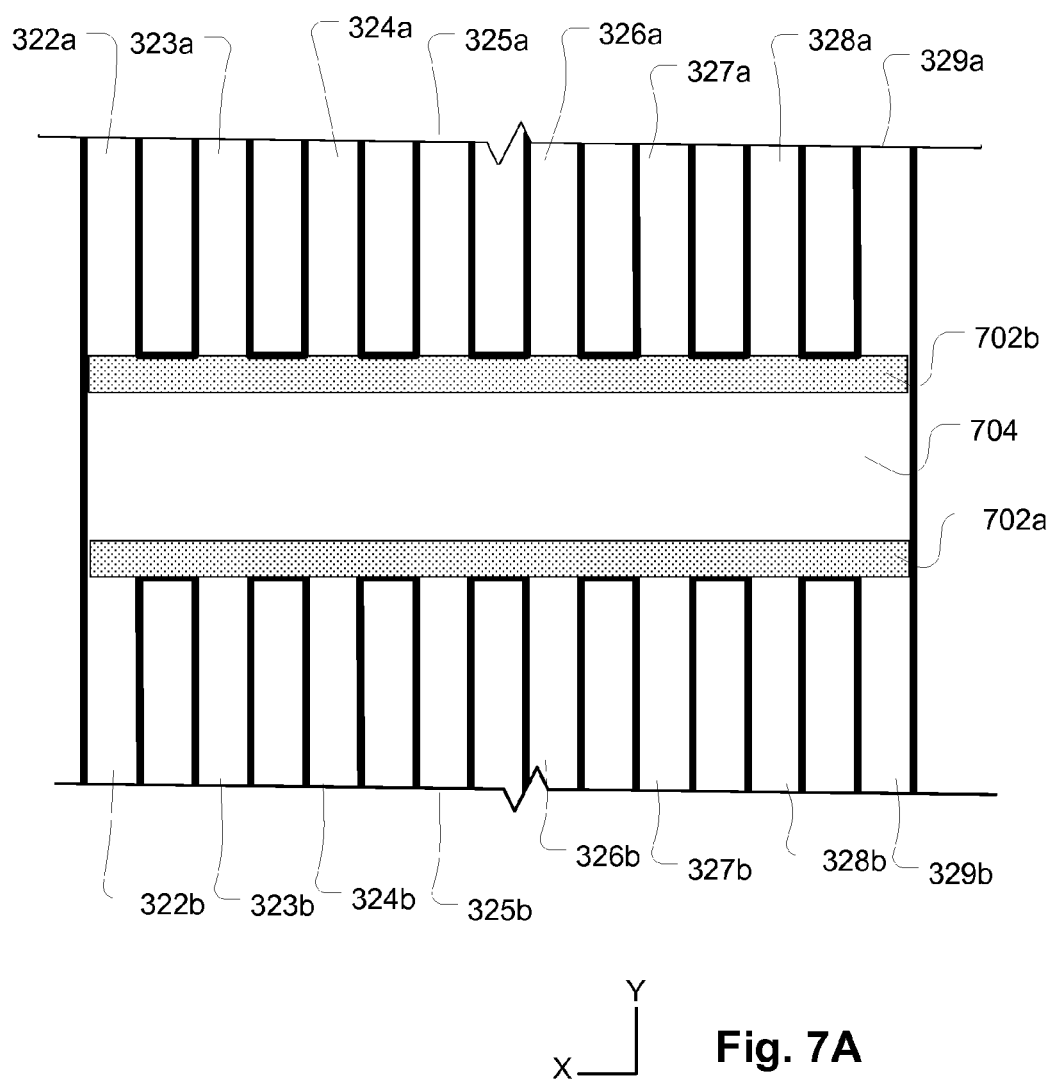

FIG. 7 is a perspective drawing of the stack of semiconductor pads 612, 614. 616, 618 after a first implantation process. FIG. 7A illustrates a corresponding top view of the stack 306 of the semiconductor pads of FIG. 7 and the corresponding active layers. As shown, the first implantation process forms outside perimeter lower resistance regions 702a and 702b along the outside perimeter of each of the semiconductor pads in the stack. Outside perimeter lower resistance regions 702a and 702b are continuous along the opposing sides of the outside perimeter, in this example, and separated by an interior region 704. In other examples, the outside perimeter lower resistance regions can be continuous around the outside perimeter including on the ends (not shown) at this stage. This can be achieved for example by relying on the straggling effect arising from spreading or diffusion of implanted ions during ion slowdown in the ion implantation process. The impurities 604 from the first implantation process decrease an electrical resistance of the outside perimeter lower resistance regions 702a and 702b relative to interior region 704 in each of the semiconductor pads in the stack according to various embodiments.

Figure 7B:
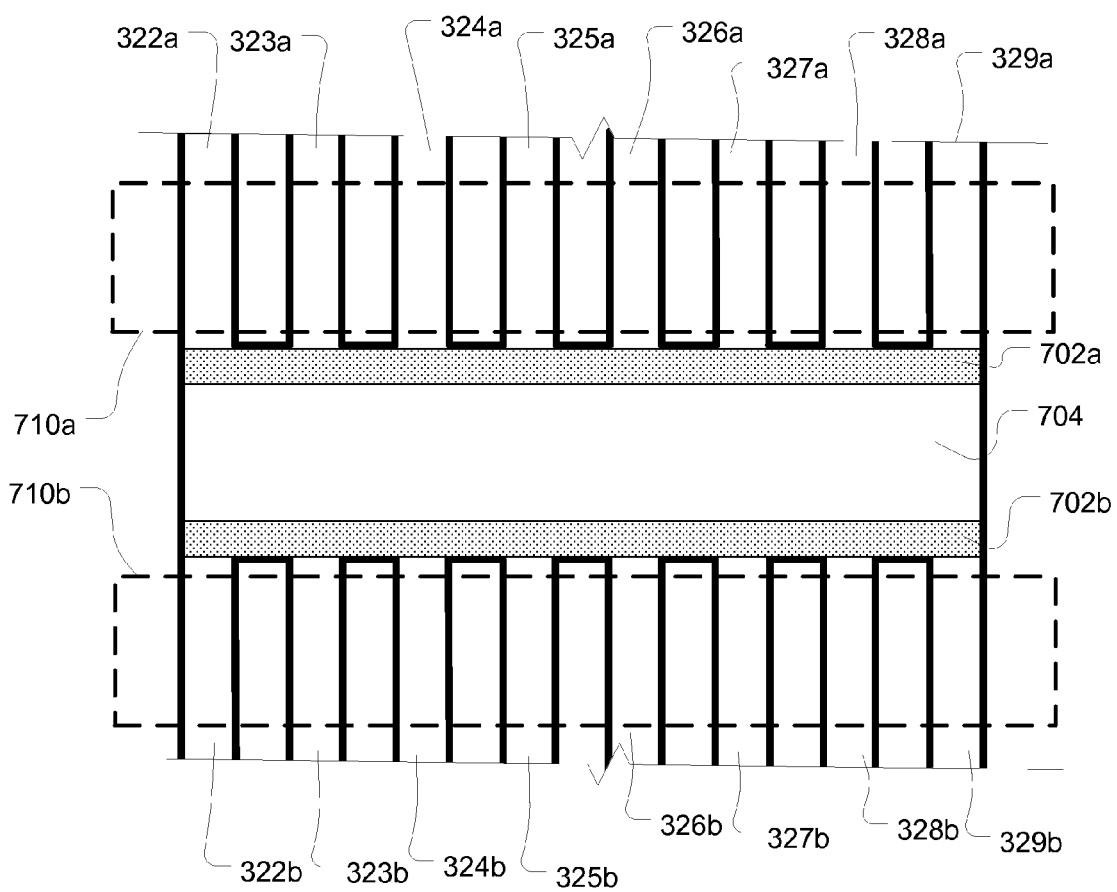

FIG. 7B is a layout view of the stack of semiconductor pads 612, 614, 616, 618 after forming conductor lines over and in between the active layers and aligned perpendicular relative to the active layers, with the outlines 710a and 710b showing the regions in which the SSL gate structures (e.g. SSL gate structure 409 in FIG. 1) are formed, which results in formation of a string select transistor near the pad, that can be used for selecting individual stacks of strips. The conductive lines (not shown in FIG. 7B) can include a plurality of word lines (425-N in FIG. 1).

Figure 8:
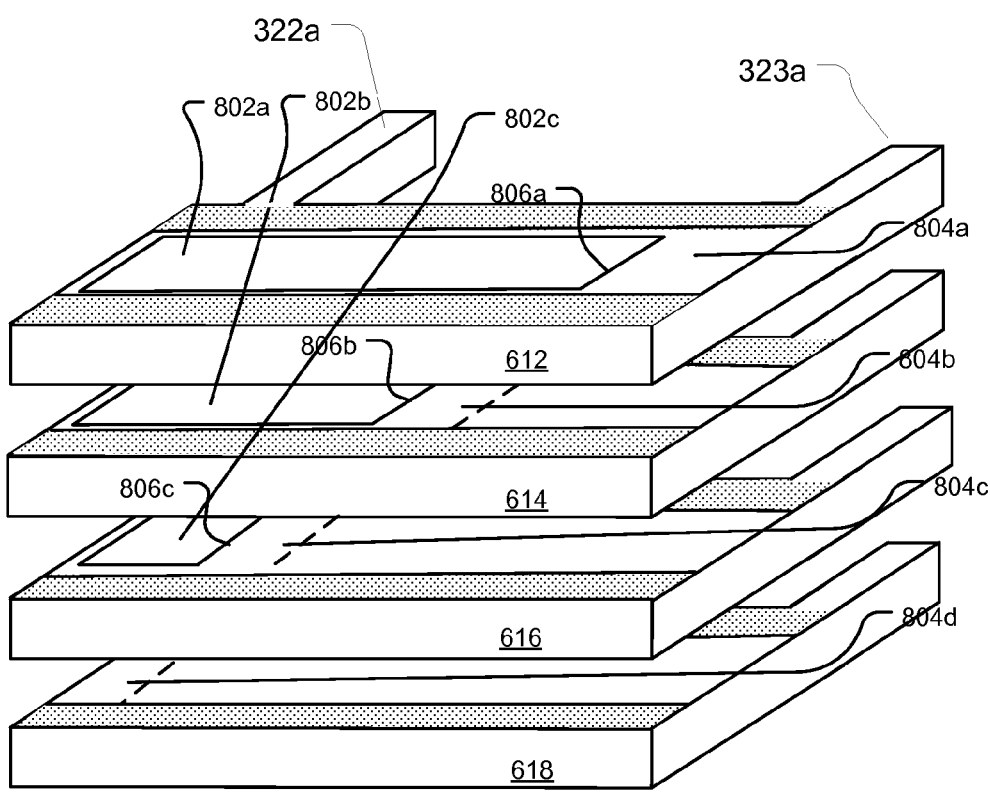

FIG. 8 is a perspective view of the stack of semiconductor pads like that in FIG. 7 after forming openings on each of the semiconductor pads except the lowest layer pad 618. As illustrated, opening 802a is formed on pad 612, opening 802b is formed on pad 614, and opening 802c is formed on pad 616. Each of the openings exposes landing areas for respective contact areas on underlying semiconductor pads and forms a stairstep structure from the semiconductor pads. As illustrated, landing area 804a is formed on pad 612, landing area 804b is formed on pad 614, and landing area 804c is formed on pad 616, and landing area 804d is formed on pad 618. Additionally, each of the openings further defines an inside perimeter for each of the respective semiconductor pads. As shown, inside perimeter 806a is associated with opening 802a on pad 612, inside perimeter 806b is associated with opening 802b on pad 614, and inside perimeter 806c is associated with opening 802c on pad 616. The stairstep structure can be formed using one or more pattern and etch processes using a successively decreasing length of a masking layer to form each of the exposed landing areas. Detail of various methods to form the stairstep structure are described in, for example, commonly owned U.S. Pat. No. 8,383,512, filed on May 14, 2011, entitled *Method for Making Multilayer Connection Structure* by inventors Shih-Hung Chen, Hang-Ting Lue, Hong-Ji Lee, and Chin-Cheng Yang, which is incorporated by reference as if fully set forth herein.

Figure 8A:
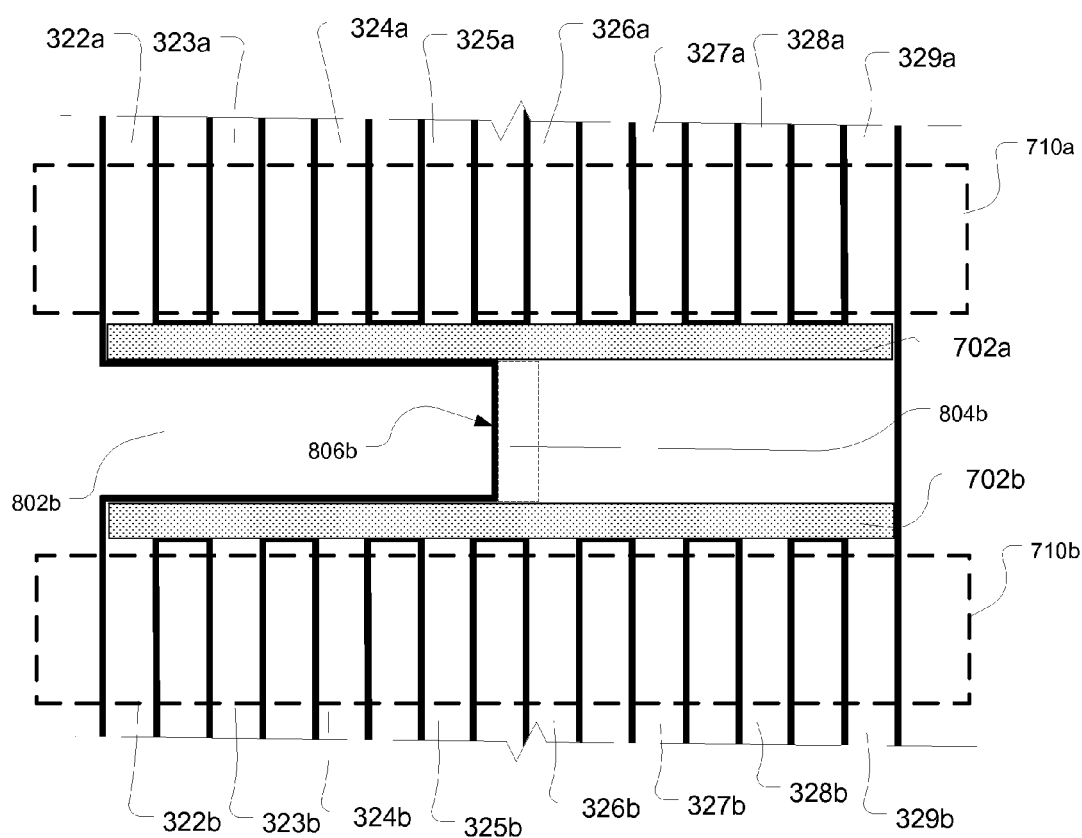

FIG. 8A is a layout view of a layer (for example pad 614) within the stack of the semiconductor pads including active strips 322a, 323a. As shown, opening 802b on pad 614 defines an inside perimeter 806b in pad 614. Exposed landing area 804b on the pad 614 lies in the region defined by opening 802a on the overlying layer 612 and opening 802b on layer 614.

Figure 9:
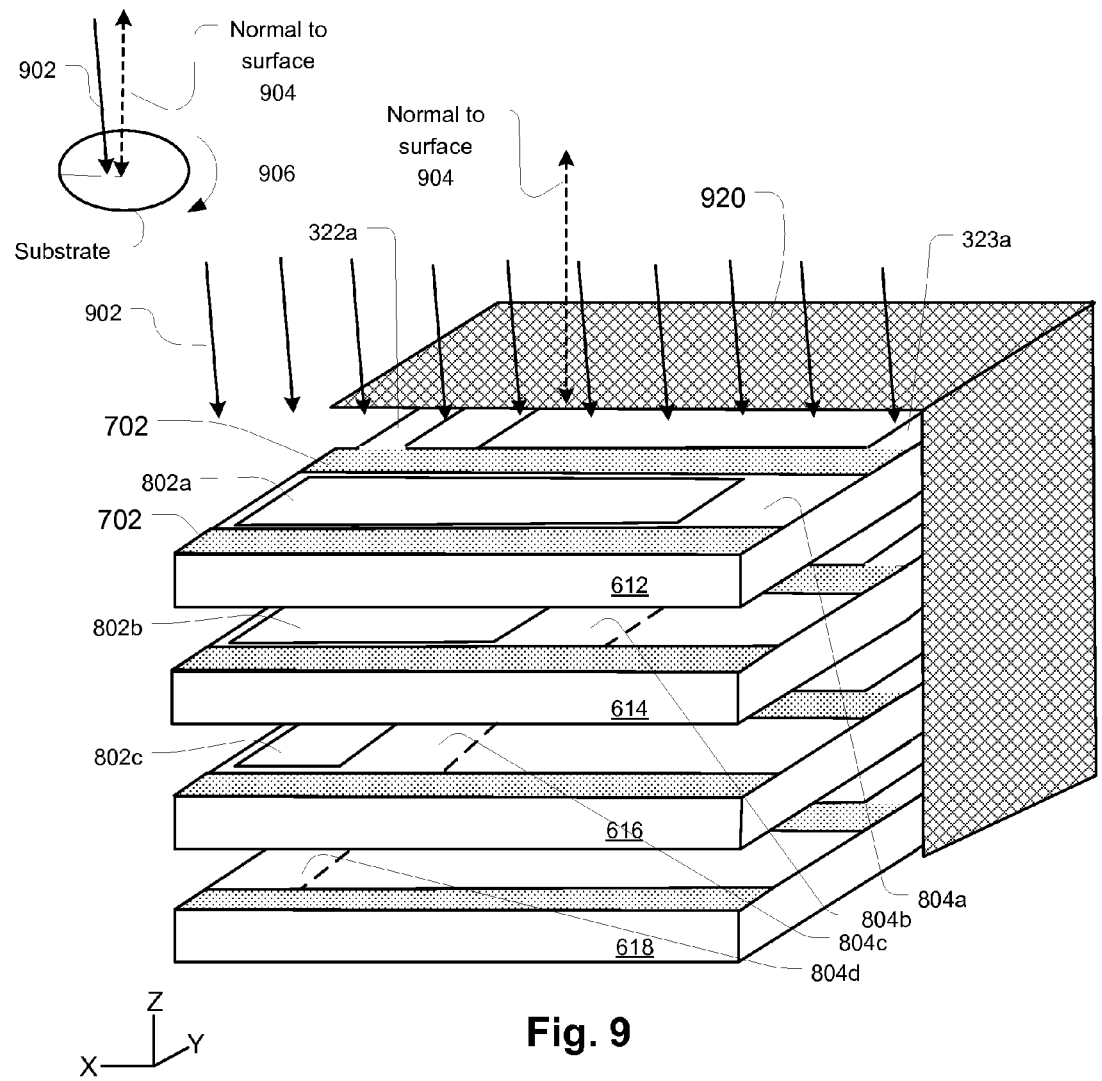

FIG. 9 illustrates a perspective view of the semiconductor pads 612, 614, 616, 618 like that of FIG. 8 during a second implantation process. The second implant process is provided using impurities (n-type or p-type) 902. The impurities 902 can have the same polarity as those used to define the regions 702a, 702b in the first implantation process. As shown, the impurities 902 are implanted at a tilt angle substantially normal to the substrate (substrate is in the X-Y plane). To allow the impurities 902 to reach regions 804a, 804b, 804c, 804d, the implantation can be carried out in a slight tilt angle of about zero to about 30 degrees. During the second implantation process, the substrate can also be rotated 906 in the XY plane to one or more suitable twist angles for a uniform distribution of the second impurity species. Additionally, the impurities can be implanted while the active strips (322a, 323a) in the stacks are covered by a mask 920, so that the implantation process does not substantially change the resistance of the strips of active material in the plurality of active layers.

Figure 10:
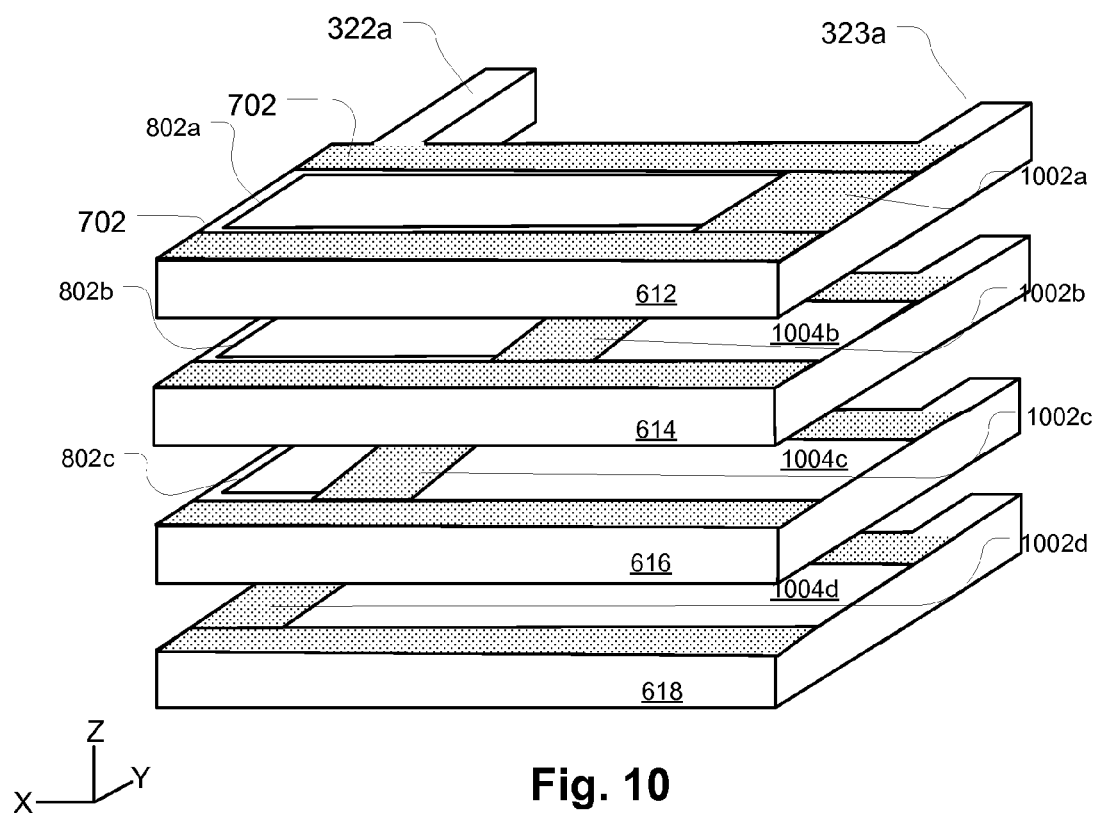
Figure 10A:
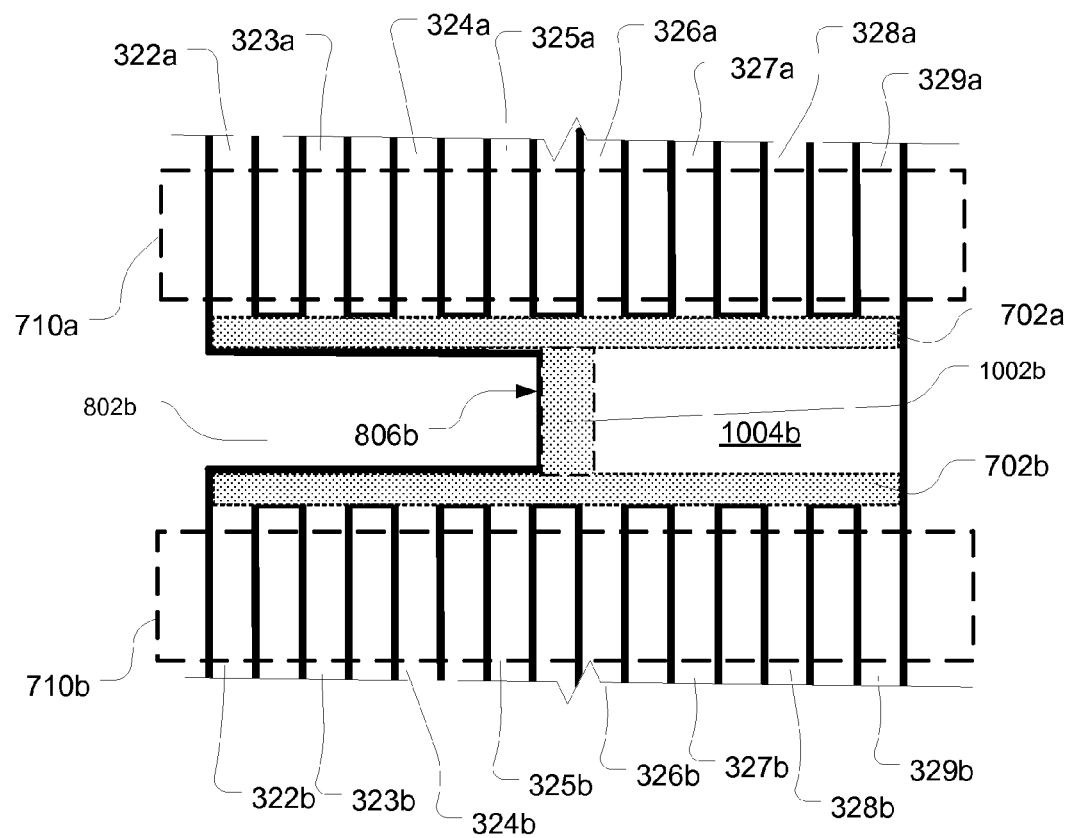

FIG. 10 is a perspective drawing of the stack of semiconductor pads 612, 614, 616, and 618 after the second implantation process. FIG. 10A is a layout view of a pad (for example pad 614) in the middle of the stack. In various embodiments, the tilt angles, the twist angles, the ion energy, and other parameters of the second implantation process are selected such that an inner lower resistance region 1002a, 1002b, 1002c, and 1002d is formed in each of the exposed landing areas on the semiconductor pads 612, 614, 616, 618, traversing each of the widths (in the Y direction) of the exposed regions. Each of the inside lower resistance regions 1002a, 1002b, 1002c, and 1002d can overlap with each of the respective outside perimeter lower resistance region to form a continuous lower resistance region. For example, on pad 614, inside lower resistance region 1002b overlaps with outside perimeter lower resistance regions 702a, 702b. Additionally, interior regions 1004b, 1004c, 1004d on respective pads 614, 616, 618 blocked by upper levels may remain at higher resistance relative to the corresponding inside perimeter lower resistance regions. As illustrated in the layout view for pad 614 in FIG. 10A, interior region 1004b on pad 614 is blocked by at least upper layer 612 during the second implantation process and remains at a substantially higher resistance relative to the inside perimeter lower resistance region 1002b and outside perimeter lower resistance regions 702a, 702b.

Figure 11:
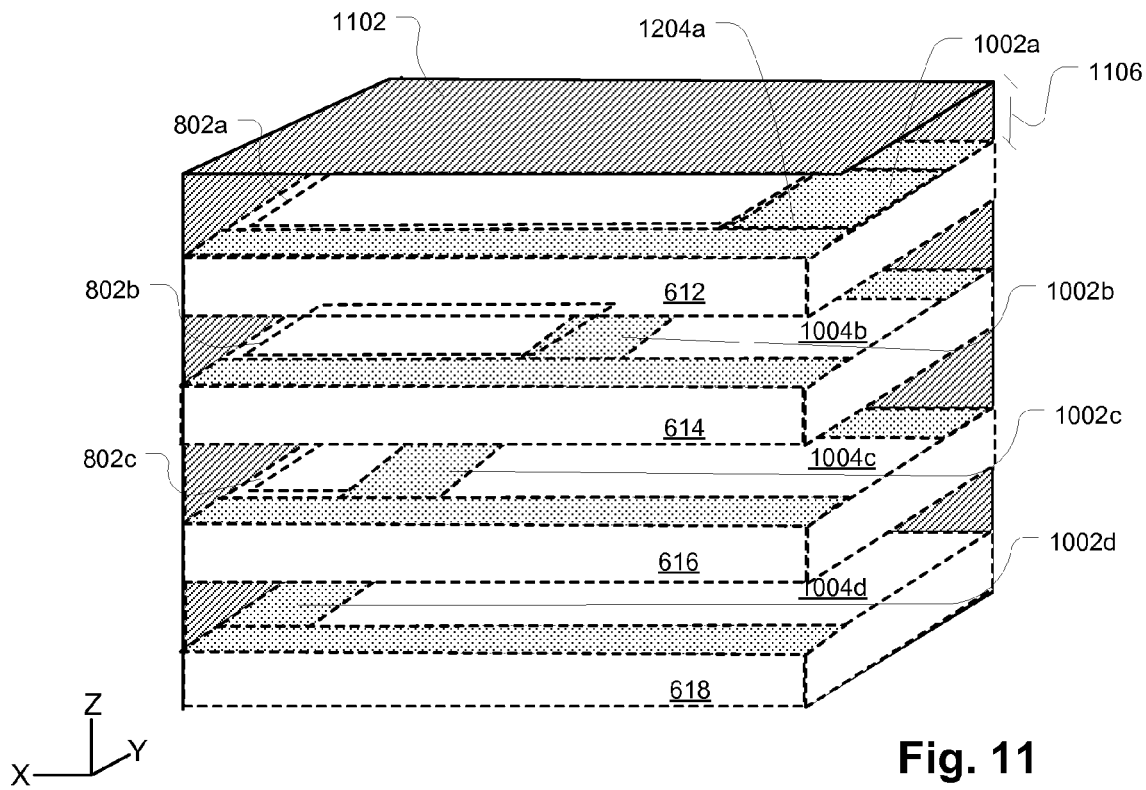
Figure 11A:
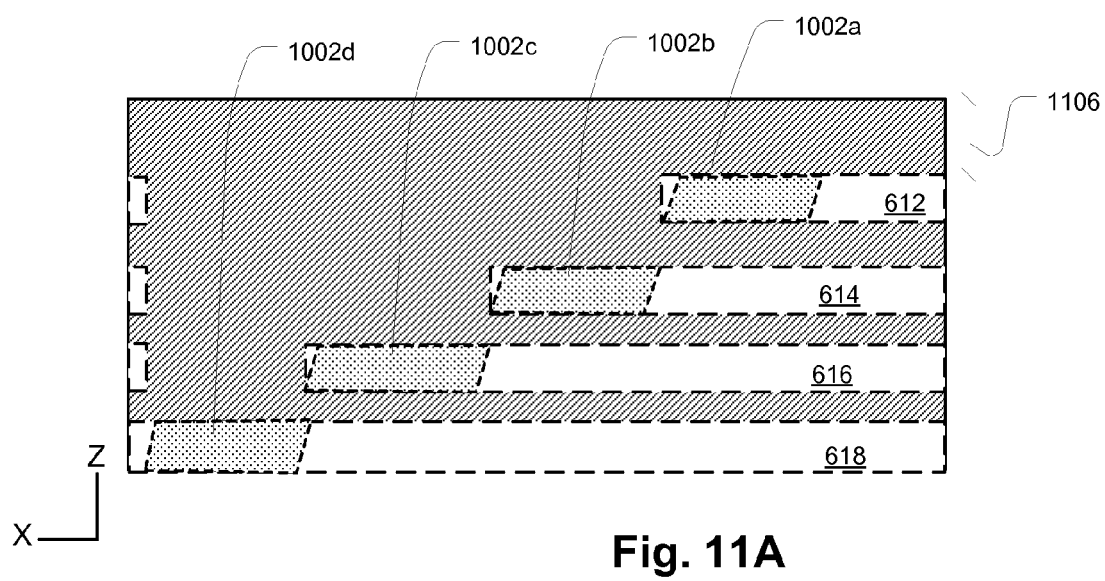

FIG. 11 is a perspective drawing of semiconductors pads 612, 614, 616, and 618 like that of FIG. 10 after deposition of an insulating fill 1102. FIG. 11A is a cross-sectional view of FIG. 11 in the X-Z plane. Insulating fill 1102 overlies the lower resistance regions 1102a, 1102b, 1102c, 1102d in the landing areas for interlayer conductors on each of the semiconductor pads 612, 614, 616, and 618, and forms a thickness 1106 over the top most layer (612 in this example). As illustrated, the lower resistance regions can include impurities that fill the entire depth of the pad in some embodiments. Insulating fill 1102 can be silicon oxide, silicon nitride, multilayer insulating material stack (for example alternating layers of silicon oxide and silicon nitride, ONO commonly known), a high K dielectric material, a low K dielectric material, or a combination of these, and others. Insulating fill 1102 can be deposited using techniques such a chemical vapor deposition (CVD) process, (for example, plasma enhanced CVD, low pressure CVD, a physical vapor deposition process, a spin-on coating process, or a combination of techniques depending on the application). The insulating fill 1102 after deposition can have a surface topography and can be planarized to form a substantially flat surface to aid in subsequent lithography processes. The planarization can be a chemical mechanical polishing process or a plasma etch back process or a combination of processes depending on the implementation.

Figure 12:
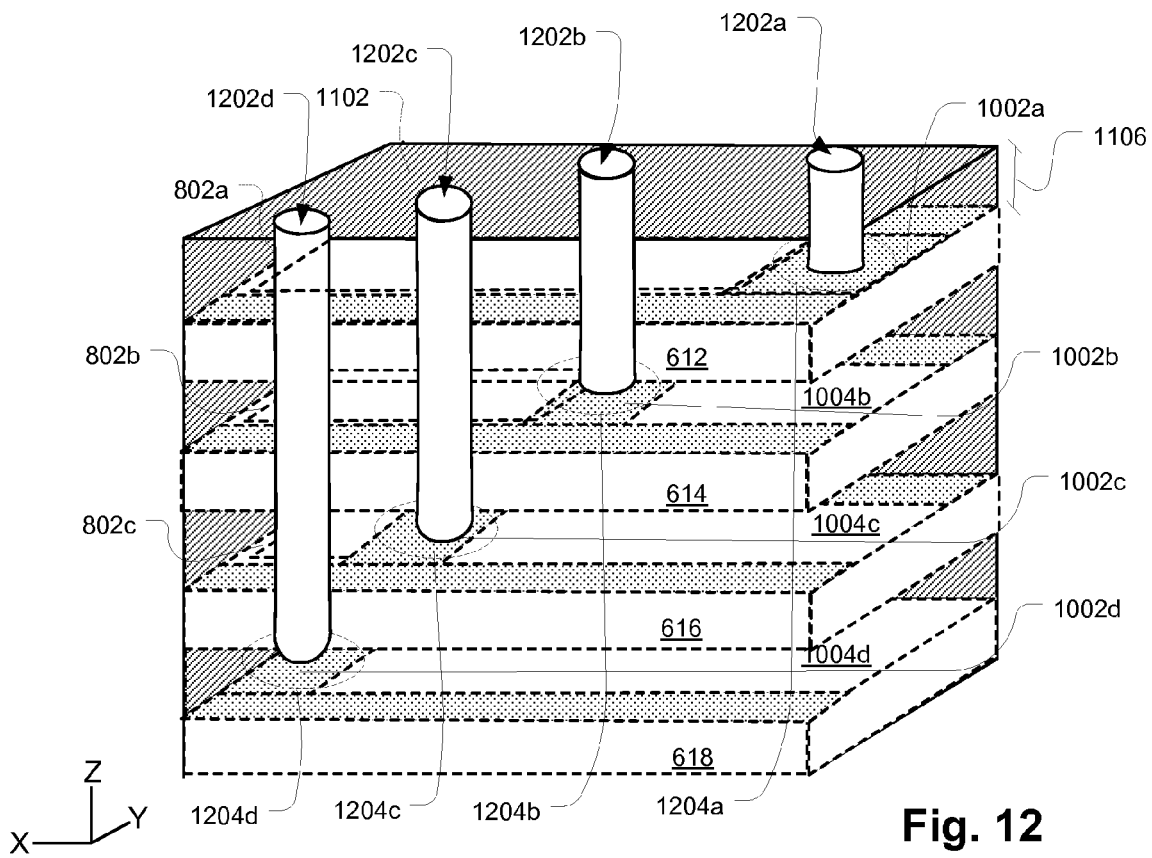
Figure 12A:
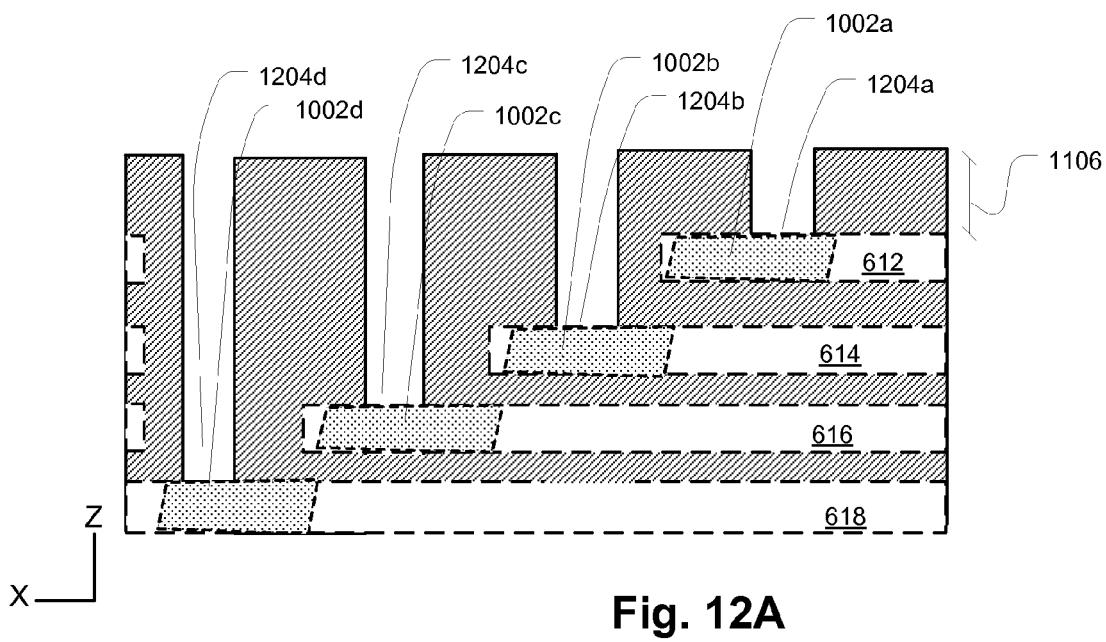

FIG. 12 is a perspective drawing of the structure in FIG. 11 after forming a plurality of contact openings 1202a, 1202b, 1202c, 1202d (or vias) in insulating fill 1102. FIG. 12A illustrates a cross sectional view of FIG. 12 in the vertical XZ plane. Each contact opening 1202a, 1202b, 1202c, 1202d extends vertically (in direction Z in the drawings) in the insulating fill to expose an inner perimeter lower resistance region surface for landing areas 1204a, 1204b, 1204c, 1204d on each of the semiconductor pads. Contact openings 1202a, 1202b, 1202c, 1202d can be formed by first forming a patterned mask over insulating fill 1102 and etching the insulating fill using the patterned mask as the masking layer. Etching of the insulating fill can use the semiconductor pad as an etch stop in various embodiments.

Figure 13:
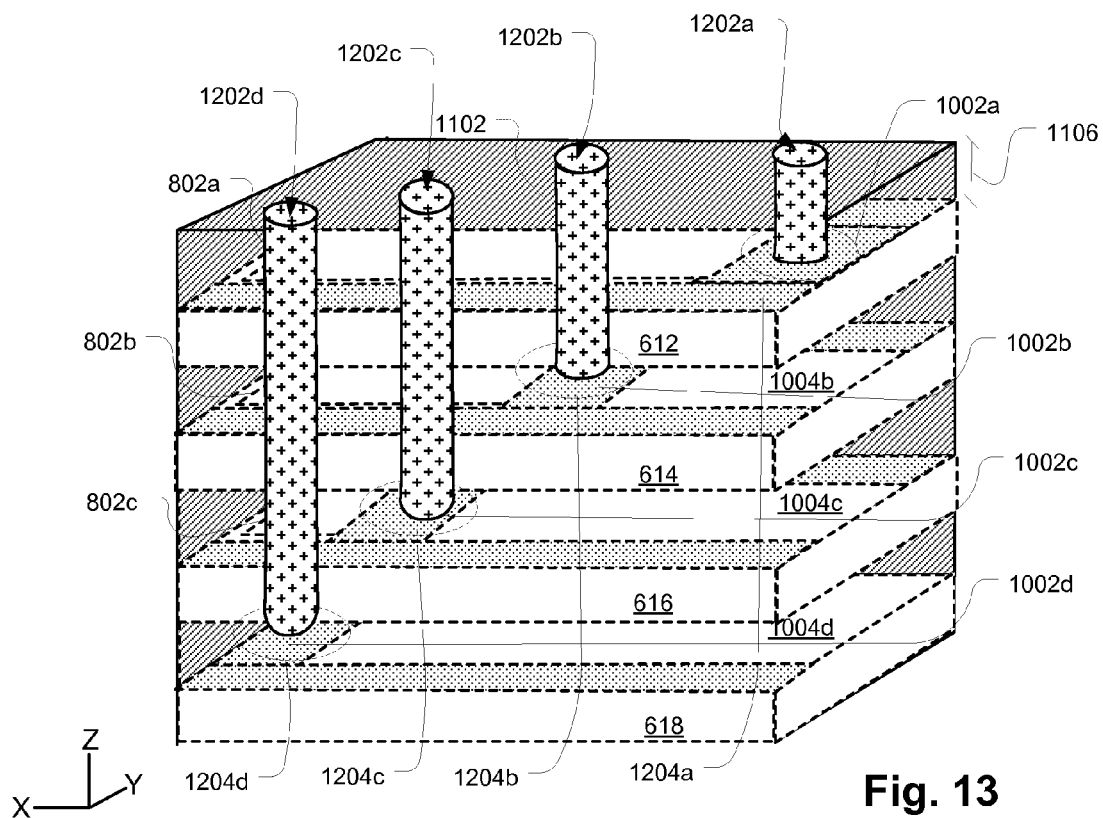
Figure 13A:
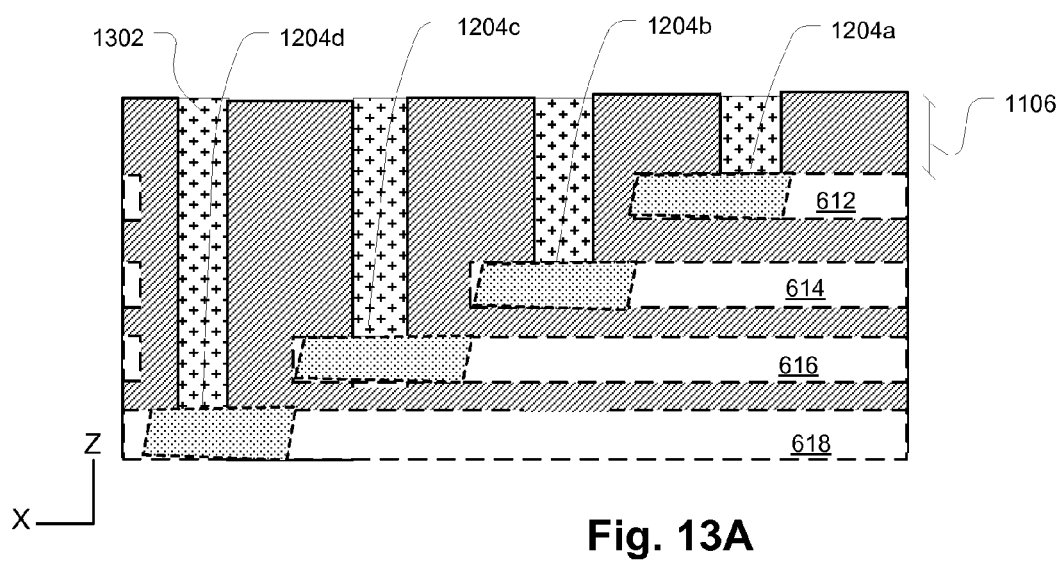

FIG. 13 is a perspective drawing of the structure like that in FIG. 12 after deposition of a conductive material 1302 to form interlayer conductors. FIG. 13A illustrates a corresponding cross-sectional view of FIG. 13 in the vertical XZ plane. Conductive material 1302 fills each of the contact openings 1202a, 1202b, 1202c, 1202d and makes physical contact and electrical contact in the landing areas 1204a, 1204b, 1204c, 1204d on each of the semiconductor pads 612, 614, 616, and 618. Conductive material 1302 can be a polysilicon doped with an impurity species having the same polarity as the inside perimeter lower resistance regions and the outside perimeter lower resistance regions. Conductive material 1302 can also be a metal material such as tungsten, copper, aluminum, and others used as interconnect material. For metal material as the conductive material, each of the contact openings is first lined using a diffusion barrier material to prevent contamination of the device by the metal material.

Figure 13B:
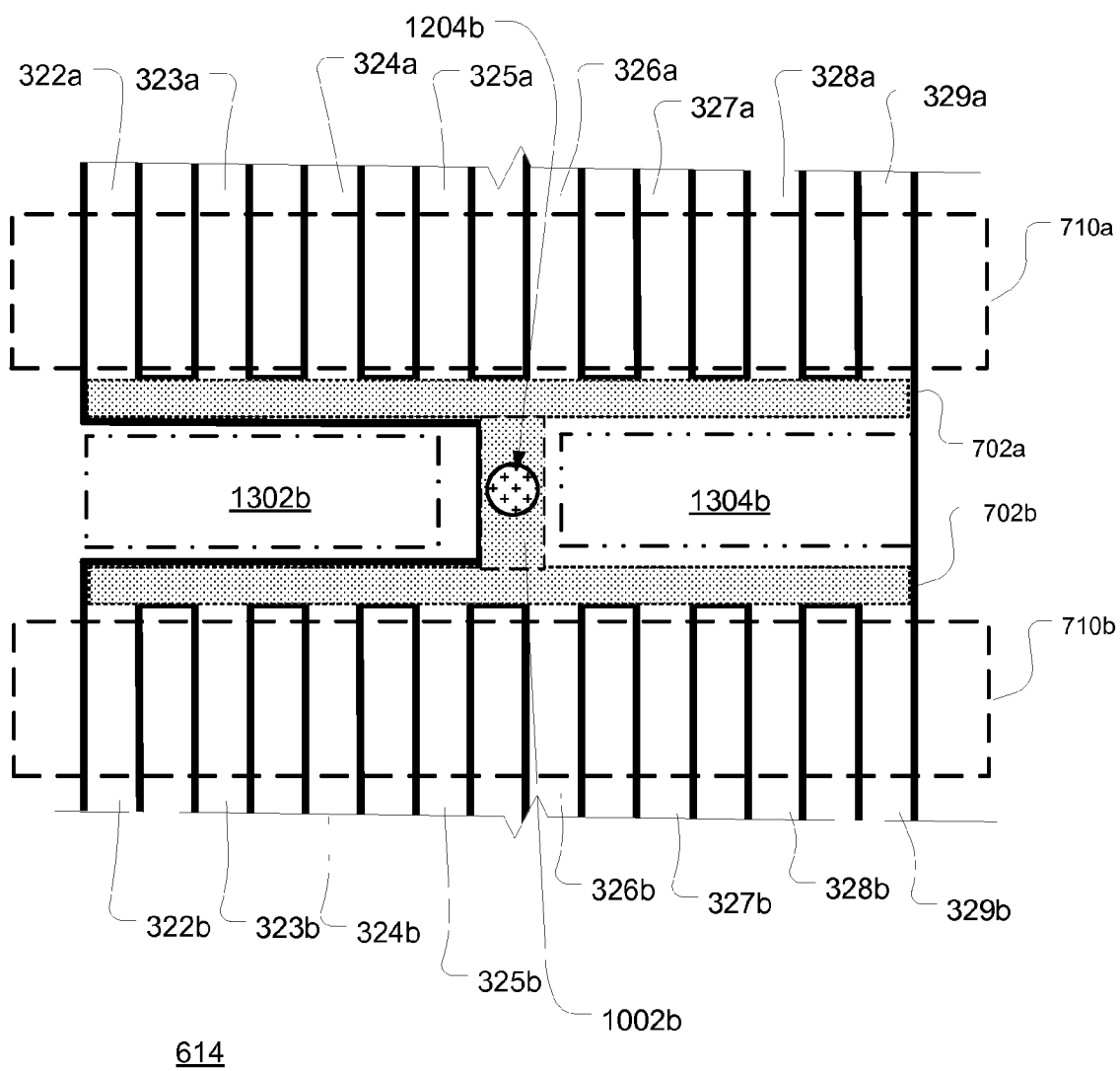

FIG. 13B is a layout view in XY plane of an example of a pad (614) in the middle of the stack of semiconductor pads in the corresponding perspective drawing in FIG. 13. Again, pad 614 in the stack of semiconductor pads is used as an example. Various elements such as active layers 322a, 323a, and SSL regions 710a, 710b are described above. Landing area 1204b in inside lower resistance region 1002b for interlayer conductor 1202b on pad 614 is shown. Contacts for semiconductor pads above pad 614 (for example, pad 612) are disposed in region 1304b while contacts for semiconductor pads below pad 614 (for example, pads 616 and 618) are disposed in region 1302b in the stairstep structure.

Thereafter, back-end-of-line processes such as metallization to form metal lines ML1, ML2 and ML3 as in FIG. 1, and passivation and others, are applied to complete the device. Metallization provides interconnects from each of the contact structures to respective read circuitry to determine a state of the corresponding memory string.

Figure 14:
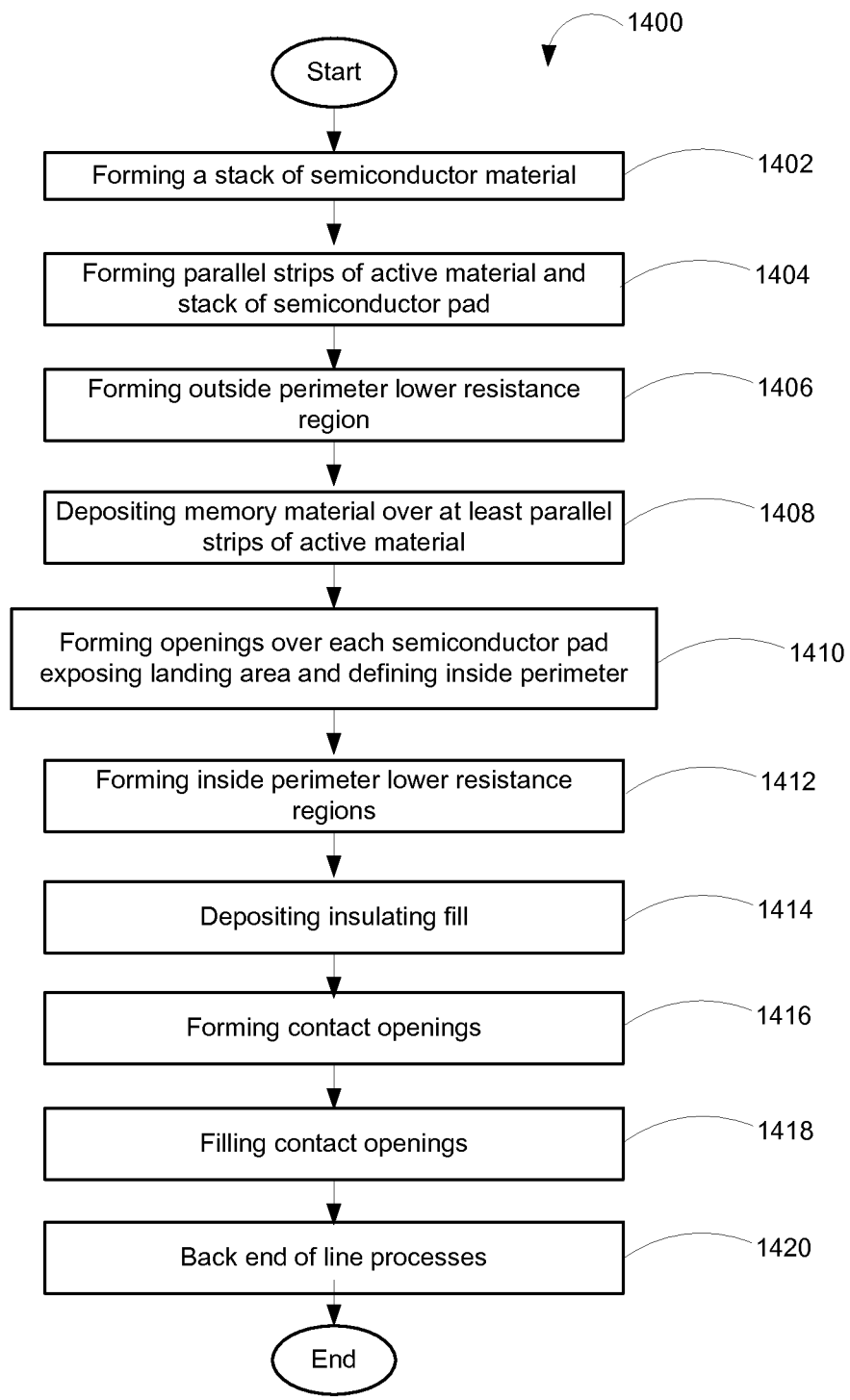
FIG. 14 illustrates a process flow for the method of forming a conductor structure for a 3D semiconductor device.

FIG. 14 illustrates an example of a process flow 1400 for a method of forming a semiconductor device. The method includes the steps of:

Step 1402: forming a stack of semiconductor material (or other active material, such as a metal, a metal nitride, a chalcogenide, etc.) separated by insulator, the semiconductor material can be undoped or lightly doped (p-type or n-type) in this example;

Step 1404: forming parallel strips of active material and a stack of semiconductor pads to form the stack of semiconductor material, the semiconductor pads have an outside perimeter and one side of the outside perimeter is coupled to a corresponding layer of parallel strips;

Step 1406: forming an outside perimeter lower resistance region on each of the semiconductor pads by implanting impurities to decrease an electrical resistance of the outside perimeter region relative to an interior region;

Step 1408: for a memory device as illustrated in FIG. 1, depositing a memory material over at least the parallel strips of active material;

Step 1410: forming openings over the semiconductor pads to expose a landing area for an interlayer conductor on each of the semiconductor pads, the openings defining an inside perimeter on the corresponding semiconductor pad;

Step 1412: forming inside perimeter lower resistance regions by implanting impurities to decrease an electrical resistance of the exposed landing regions relative to interior regions;

Step 1414: depositing an insulating fill over the semiconductor pads;

Step 1416: forming contact openings (or vias) in portions of the insulating fill to expose the landing areas on each semiconductor pad;

Step 1418: filling the contact openings with a conductive material, for example, doped polysilicon material or a metal material; and Step 1420: applying back-end-of-line processes to complete the device.

The above sequence of steps provides a method for forming low resistance landing areas for contact conductors for a high density 3D device according to various embodiments. The lower resistance landing areas are formed on semiconductor pads coupled to corresponding active strips configured as various circuits, for example, bit lines or word lines for a memory device. Depending on the implementation, the process steps may be carried out in different sequences than that shown in FIG. 14. For example, the memory material may be deposited (steps 1408) before forming the outside perimeter lower resistance regions on the semiconductor pads (step 1406).

Figure 15:
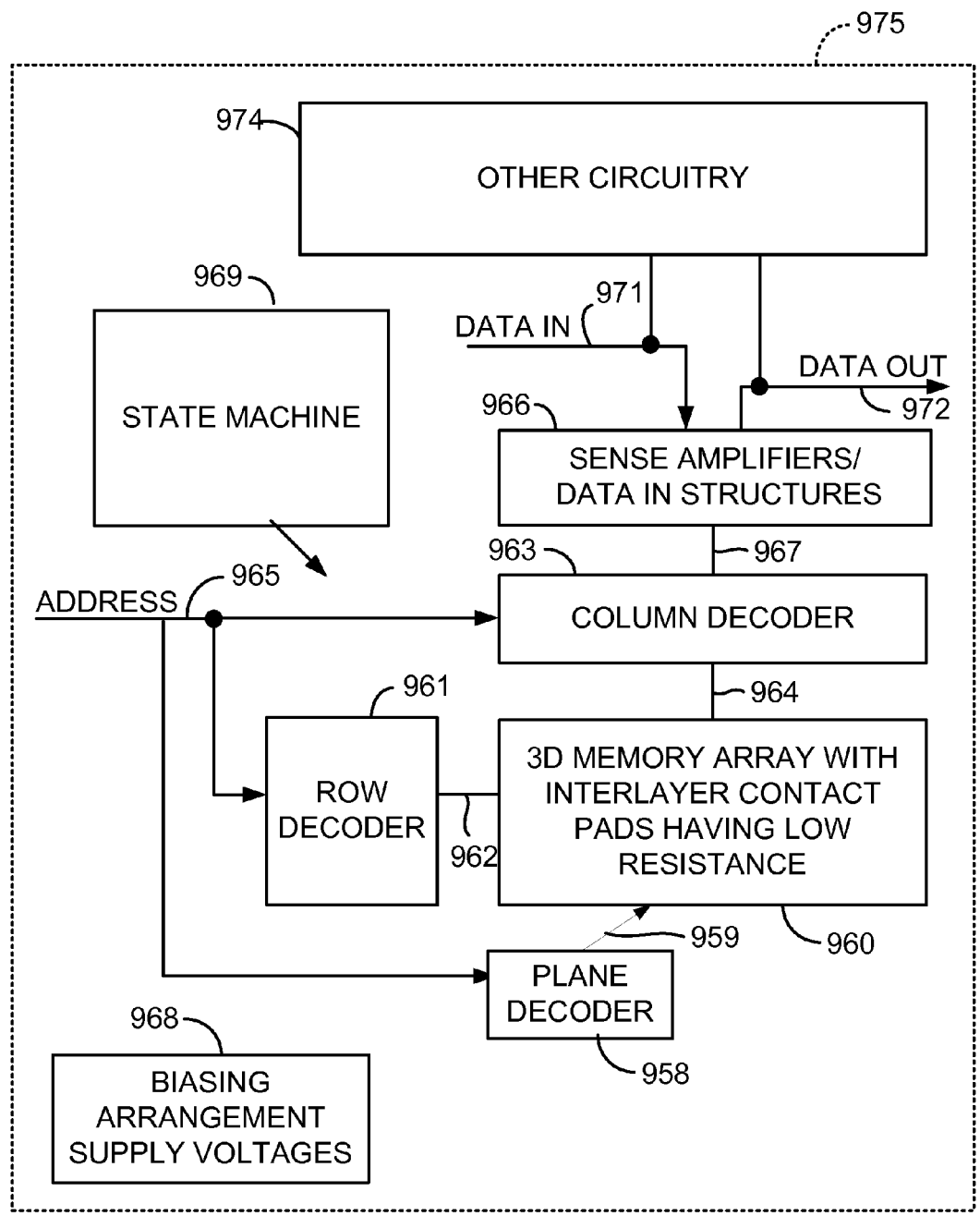
FIG. 15 is a schematic diagram of an integrated circuit including a 3D NAND-flash memory array with row, column and plane decoding circuitry.

FIG. 15 is a simplified block diagram of an integrated circuit according to an embodiment of the present invention. The integrated circuit line 975 includes a 3D NAND flash memory array 960, having a structure like that of FIG. 1 for example, on a semiconductor substrate with lower resistance pads on each active layer. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In various embodiments, a device is provided. The device can be fabricated using the process as in FIG. 14. The device includes a circuit which is made of a plurality of active layers and a stack of semiconductor pads coupled to respective active layers in the plurality of active layers. The semiconductor pads can include lightly doped polysilicon or undoped polysilicon. Depending on the implementation, the plurality of active layers can be configured as word lines or bit lines for a memory device. The semiconductor pads in the stack include outside perimeters. The outside perimeters each include at least one side coupled to a respective active layer in the plurality of active layers. The semiconductor pads include outside perimeter lower resistance regions having implanted impurities provided at one or more angle away from the normal to decrease the resistivity of the semiconductor pads around the outside perimeters. In various embodiments, the device includes openings. Each of the openings exposes landing areas on respective semiconductor pads and defines an inside perimeter on at least one of the semiconductor pads overlying the corresponding semiconductor pad. Additionally, the semiconductor pads include inside perimeter lower resistance regions along the inside perimeters. The inside perimeter lower resistance regions includes implanted impurities provided at substantially normal with respect to a substrate surface to decrease the resistance of the landing area relative to the interior regions.

In various embodiments, an integrated circuit memory device is provided. The memory device includes a 3D array of memory cells. The 3D array of memory cells includes a plurality of active layers. The active layers include patterned layers of semiconductor material. In certain implementation, the patterned layers include parallel strips of semiconductor material configured as local word lines or local bit lines for the memory cells connected on each of their ends to respective semiconductor pads. The semiconductor pads can be fabricated using the method as illustrated in the process in FIG. 14. Each of the semiconductor pads includes an outside perimeter with one side connected to the parallel strips of semiconductor material. In various implementations, the semiconductor pads in the plurality of patterned layers are disposed in a stack. The semiconductor pads include outside perimeter lower resistance regions along the outside perimeters and openings in the stack of semiconductor pads. Each of the openings exposes a landing area for a contact conductor on a corresponding semiconductor pad in the stack, and further defines an inside perimeter on at least one of the semiconductor pads overlying a corresponding semiconductor pad. Inside perimeter lower resistance regions are configured along the inside perimeters of each of the semiconductor pads in the stack.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming interconnect contact structures; comprising:
    forming a stack of semiconductor pads which are coupled to respective active layers of a circuit, semiconductor pads in the stack having outside perimeters each including at least one side coupled to the respective active layer;
    forming outside perimeter lower resistance regions along the outside perimeters of the semiconductor pads;
    forming openings in the stack of semiconductor pads, each opening exposing a landing area on a corresponding semiconductor pad, and defining an inside perimeter on at least one of the semiconductor pads overlying said corresponding semiconductor pad; and
    forming inside perimeter lower resistance regions along the inside perimeters of the semiconductor pads.

2. The method of claim 1, wherein the inside perimeter lower resistance regions comprise the landing areas and overlap with the outside perimeter lower resistance regions.

3. The method of claim 1, wherein the semiconductor pads comprise polysilicon relatively lightly doped, or undoped.

4. The method of claim 1, wherein said forming outside perimeter lower resistance regions includes implanting impurities to decrease resistivity in said outside perimeter lower resistance regions relative to interior regions of the pads.

5. The method of claim 4, wherein said implanting impurities includes directing the impurity species at one or more angles of incidence away from the normal around the outside perimeters.

6. The method of claim 5, wherein said implanting impurities includes directing the impurity species at a substantially normal angle of incidence through said openings and onto the landing areas.

7. The method of claim 1, wherein said forming inside perimeter lower resistance regions includes implanting impurities to decrease resistivity in said landing areas and said inside perimeter lower resistance regions relative to interior regions of the pads.

8. The method of claim 1, including forming an insulator fill material over the stack of semiconductor pads and the openings, and forming a plurality of interlayer conductors through the insulator fill material in the openings to contact the landing areas.

9. The method of claim 1, wherein the stack of semiconductor pads is connected to a plurality of strips of active material in the corresponding active layer, the strips of active material comprising components of memory cells.

10. The method of claim 9, wherein the plurality of strips of active material comprise local bit lines for memory cells in said circuit.

11. The method of claim 9, wherein the plurality of strips of active material comprise local word lines for memory cells in said circuit.

12. The method of claim 9, including protecting the plurality of strips during said steps of forming outside perimeter lower resistance regions and forming inside perimeter lower resistance regions on said pads.

13. A device, comprising:
    a circuit including a plurality of active layers;
    a stack of semiconductor pads coupled to respective active layers in the plurality of active layers, semiconductor pads in the stack having outside perimeters each including at least one side coupled to the respective active layer;
    the semiconductor pads having outside perimeter lower resistance regions along the outside perimeters;
    openings in the stack of semiconductor pads, each opening exposing a landing area on a corresponding semiconductor pad, and defining an inside perimeter on at least one of the semiconductor pads overlying said corresponding semiconductor pad; and
    the semiconductor pads having inside perimeter lower resistance regions along the inside perimeters.

14. The device of claim 13, wherein the inside perimeter lower resistance regions comprise the landing areas and overlap with the outside perimeter lower resistance regions.

15. The device of claim 13, wherein the semiconductor pads comprise polysilicon relatively lightly doped, or undoped.

16. The device of claim 13, wherein said outside perimeter lower resistance regions have implanted impurities that decrease resistivity in said outside perimeter lower resistance regions relative to interior regions of the pads.

17. The device of claim 16, wherein said implanted impurities are formed by directing the impurities at one or more angles of incidence away from the normal around the outside perimeters.

18. The device of claim 13, wherein said inside perimeter lower resistance regions have implanted impurities that decrease resistivity in said landing areas and said inside perimeter lower resistance regions relative to interior regions of the pads.

19. The device of claim 18, wherein said implanted impurities are formed by directing the impurities at a substantially normal angle of incidence through said openings and onto the landing areas.

20. The device of claim 13, including an insulator fill material over the stack of semiconductor pads and the openings, and a plurality of interlayer conductors through the insulator fill material in the openings to contact the landing areas.

21. The device of claim 13, wherein an active layer in the plurality of active layers comprises a plurality of strips of active material in contact with one of the semiconductor pads in the stack, the strips of active material comprising components of memory cells.

22. The device of claim 21, wherein the plurality of strips of active material comprises local bit lines for memory cells in said circuit.

23. The device of claim 21, wherein the plurality of strips of active material comprises local word lines for memory cells in said circuit.

24. An integrated circuit memory device, comprising:
    an array of memory cells, including a plurality of active layers, active layers in the plurality comprising patterned layers of semiconductor material, the patterned layers including parallel strips of semiconductor material connected on their ends to a semiconductor pad, the semiconductor pad having an outside perimeter with one side connected to the parallel strips;

the semiconductor pads in the plurality of patterned layers being disposed in a stack;

the semiconductor pads having outside perimeter lower resistance regions along the outside perimeters;

openings in the stack of semiconductor pads, each opening exposing a landing area on a corresponding semiconductor pad in the stack, and defining an inside perimeter on at least one of the semiconductor pads overlying said corresponding semiconductor pad;

the semiconductor pads having inside perimeter lower resistance regions along the inside perimeters.

25. The device of claim 24, wherein the inside perimeter lower resistance regions comprise the landing areas and overlap with the outside perimeter lower resistance regions.

26. The device of claim 24, wherein the parallel strips comprise local bit lines for memory cells in said circuit.

27. The device of claim 24, wherein the parallel strips comprise local word lines for memory cells in said circuit.

\* \* \* \* \*